United States Patent [19]

Kinney et al.

[11] Patent Number: 4,558,508

[45] Date of Patent: Dec. 17, 1985

[54] PROCESS OF MAKING DUAL WELL CMOS SEMICONDUCTOR STRUCTURE WITH ALIGNED FIELD-DOPINGS USING SINGLE MASKING STEP

[75] Inventors: Wayne I. Kinney, Albuquerque, N. Mex.; Charles W. Koburger, III, Underhill, Vt.; Jerome B. Lasky, Essex Jct., Vt.; Larry A. Nesbit, Williston, Vt.; Ronald R. Troutman; Francis R. White, both of Essex Jct., Vt.

[73] Assignee: International Business Machines Corporation, N.Y.

[21] Appl. No.: 660,673

[22] Filed: Oct. 15, 1984

[51] Int. Cl.[4] .................. H01L 21/22; H01L 21/265; H01L 29/78

[52] U.S. Cl. ...................................... 29/571; 29/578; 29/576 B; 29/577 C; 148/1.5; 148/188; 148/DIG. 43; 148/DIG. 53; 148/DIG. 100; 148/DIG. 157; 357/42

[58] Field of Search ..................... 29/571, 578, 577 R, 29/577 C, 576 B; 148/1.5, 188, DIG. 43, DIG. 53, DIG. 85, DIG. 100, DIG. 151, DIG. 157; 357/42, 44, 50

[56] References Cited

U.S. PATENT DOCUMENTS

| | | | |
|---|---|---|---|
| 4,013,484 | 3/1977 | Boleky et al. | 357/42 X |
| 4,144,101 | 3/1979 | Rideout | 148/1.5 |
| 4,244,752 | 1/1981 | Henderson et al. | 148/1.5 |
| 4,280,272 | 7/1981 | Egawa et al. | 29/571 |
| 4,306,916 | 12/1981 | Wollesen et al. | 357/42 X |
| 4,315,781 | 2/1982 | Henderson | 357/42 X |
| 4,435,896 | 3/1984 | Parrillo et al. | 29/571 |

*Primary Examiner*—Brian E. Hearn
*Assistant Examiner*—David A. Hey
*Attorney, Agent, or Firm*—Sughrue, Mion, Zinn, Macpeak & Seas

[57] ABSTRACT

A process for making a CMOS dual-well semiconductor structure with field isolation doping, wherein only a single lithographic masking step is required for providing self-alignment both of the wells to each other and also of the field isolation doping regions to the wells. The lithographic masking step forms a well mask and defines an oxidation barrier which acts as: an implant mask (absorber) during the ion-implantation of a field dopant of one type; an oxidation barrier over one well during the oxidation of the opposite-type well to form over the one well a sacrificial oxide layer which forms the alignment marks for subsequent formation of the field-doping regions; and a dopant-transmitter during the ion-implantation of an opposite-type field dopant which is simultaneously absorbed by the sacrificial oxide. As a result, there are formed field-doped oxide layers self-aligned to the wells so that, with a subsequent masking step, oxide field isolations are defined over the doped oxide layers. A heat cycle is then used to drive the field dopants into the corresponding field-doping regions.

7 Claims, 14 Drawing Figures

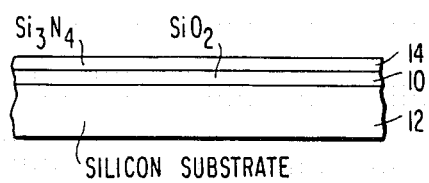
FIG. 1
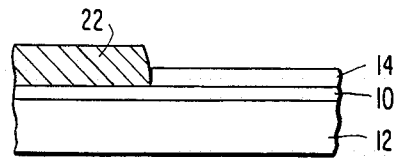
FIG. 6
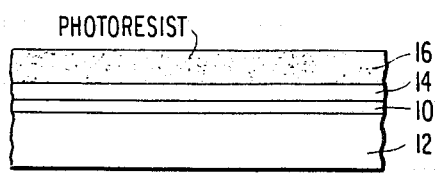
FIG. 2
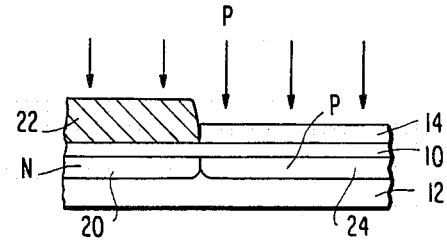
FIG. 7
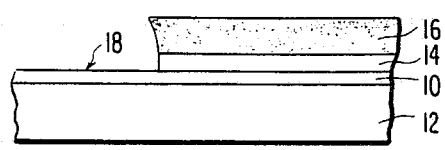
FIG. 3
FIG. 8
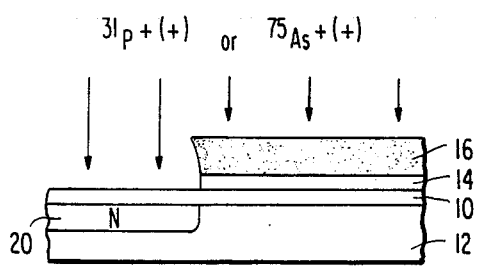
FIG. 4
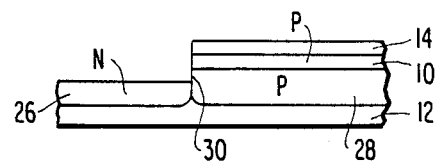
FIG. 9
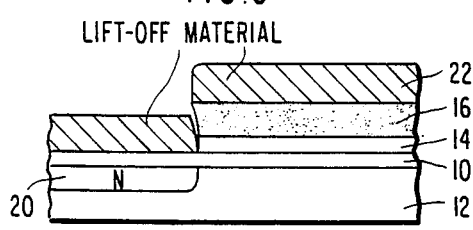
FIG. 5
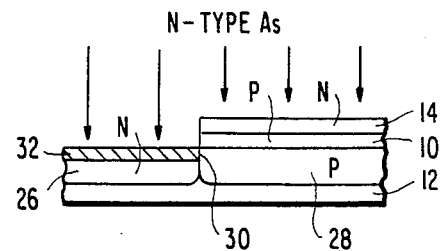
FIG. 10

PROCESS OF MAKING DUAL WELL CMOS SEMICONDUCTOR STRUCTURE WITH ALIGNED FIELD-DOPINGS USING SINGLE MASKING STEP

BACKGROUND OF THE INVENTION

This invention relates generally to the field of CMOS (complementary metal oxide semiconductor) technology and, more particularly, to a process which uses a single masking step to form self-aligned dual wells (tubs) and self-aligned field-doping regions in a CMOS structure forming a part of a semiconductor device, such as a field effect transistor.

In dual-well (twin-tub) CMOS technology, it is highly desirable to utilize as much of the semiconductor chip area as possible. In the past, several lithographic masking steps were required for making integrated circuit chips having densely packed elements and devices thereon, but each masking step inherently requires the dedication of chip areas which otherwise could be occupied by the devices ultimately formed in the chip. Also, in the past, the doping concentration of the dual wells and also of the field regions were dependent upon each other, and/or both P and N field isolation regions were doped with a conductivity-determining impurity of a first type, one region masked, and the other region doped with a conductivity-determining impurity of the opposite type to form the required P-doped and N-doped field isolation regions.

In forming field isolation regions between devices on a chip, it is necessary to provide field-doping beneath these isolation regions to provide electrical isolation between adjacent devices or active regions on the same substrate which is, typically, a lightly doped silicon wafer. The fabrication step or steps that produce these isolation regions affects the spacing between devices (i.e. the device packing density) on the chip, as well as the electrical characteristics of the device. The field-doping beneath the isolation regions is often referred to as a "parasitic channel stopper" doping, and it is used to control the parasitic MOS threshold voltages outside of the active region of a device, such as an FET, and to eliminate unwanted conduction due to inversion under the field isolation when lightly doped substrates are employed. There are many prior art techniques for aligning the field-doping to the field isolation. One technique is to use an extra lithographic masking step; however, the disadvantages of such an extra masking step have already been discussed. In order to form a recessed isolation oxide with a self-aligned field-doping, it is also known to provide an oxidation barrier layer, such as silicon nitride, for delineating the device regions. Thin silicon dioxide layers may be provided on either side of the silicon nitride layer to aid in its delineation and to prevent damage to the underlying silicon substrate. The photoresist pattern used to define the device regions also serves as the implantation mask, and the resist regions are located over the future device areas.

U.S. Pat. No. 4,144,101—Rideout discloses the broad concept of providing a self-aligned field-doping using only one lithographic masking step. It is important to employ as few masking steps as possible since the lithographic masking steps involved in preparing integrated circuits are among the most critical. Lithographic masking steps require high precision and registration and extreme care in execution. Each additional lithographic masking step in a process introduces possible masking defects and increases mask-to-mask registration problems that decrease the processing yield and, accordingly, significantly increases the fabrication cost. Although other factors affect the yield and cost, such as, for example, the number of high temperature heat treatments, a basic objective in FET integrated circuit fabrication is to minimize the number of basic lithographic masking steps required to produce a particular integrated circuit array of desired device structures. U.S. Pat. No. 4,144,101 discloses a process wherein the incorporation of the doping beneath the preselected isolation regions and the fabrication of the isolation regions require only a single lithographic masking step. More specifically, this patent discloses a process for providing ion-implanted doped regions in a substrate beneath preselected regions of an existing layer on the substrate, wherein the doped regions are self-aligned to preselected subsequently fabricated regions of the existing layer. The process includes providing a first layer of silicon dioxide on a silicon substrate. Ion-implanted doped regions are to be later formed beneath preselected portions of the oxide layer. A resist masking layer is formed on the oxide layer, and active impurities are ion-implanted through the oxide layer in those regions not covered by the resist masking material in order to provide ion-implanted regions beneath the oxide layer, whereby the resist and oxide layers act as a mask to prevent the implanted ions from penetrating therethrough. A lift-off material, such as aluminum, is deposited over the oxide layer and resist layer, and then the resist layer is removed, taking with it the lift-off material deposited on it. Then, the portion of the oxide layer which was beneath this layer is removed by etching, using the remaining lift-off material as a mask. Then, the remaining lift-off material is removed from the oxide layer beneath it, whereby there are obtained implanted regions in the substrate which are self-aligned at the edges to the boundaries of preselected fabricated regions of the oxide layer located above the ion-implanted regions. In other words, by the use of this lift-off technique, the masking pattern is actually reversed from over the device region before implantation, to over the field isolation region after implantation. After the formation of the field-doping regions which are self-aligned at the edges to the overlying isolation field oxide regions, further lithographic and ion-implantation steps are used to form the oxides, device-doping and conductors required to complete the fabrication of an FET having gate, source and drain regions. This lift-off technique is used in one embodiment of the present invention.

U.S. Pat. No. 4,435,896—Parrillo et al discloses a dual-well or twin-tub CMOS process using only a single lithographic masking step for forming self-aligned contiguous P- and N-wells. A silicon nitride layer and a silicon dioxide layer of different thicknesses are used to achieve this self-alignment of the wells; however, this patent does not address the problem of forming field-doping beneath field isolation regions.

U.S. Pat. No. 4,280,272—Egawa et al discloses a process of making a twin-well CMOS FET by using the conventional method of employing two masking steps to form spaced N- and P-wells.

U.S. Pat. No. 4,244,752—Henderson, Sr. et al discloses a process for making CMOS FET integrated circuits having both P-channel and N-channel structures, and in which only a P-channel well is formed. Both silicon dioxide and silicon nitride layers are formed on a P-type wafer to produce a silicon dioxide-silicon nitride sandwich, and a first masking step is used to etch away this sandwich to define the active areas of both the P-channel and N-channel devices to be formed later in those areas covered by the sandwich. A second masking step is used to form a photoresist pattern to enable ion-implantation to form a P-channel well. With the oxide-nitride sandwich serving as a mask, field-doping regions are formed by ion-implantation of a P-type dopant (boron). This implant goes into the field regions of both the N-channel well, where it is required, and the P-channel well where it is not desired. Field isolation oxides are then formed over the field-doping regions, using the silicon nitride layer as a mask to prevent oxidation of the active areas of the P-channel and N-channel devices.

SUMMARY OF THE INVENTION

The primary object of the invention is to provide an improved process for making a CMOS dual-well semiconductor structure with field isolation doping, wherein only a single lithographic masking step is required for providing self-alignment both of the wells to each other and also of the field isolation doping regions to the wells.

Another object is to provide such a process wherein the slower-diffusing N-well dopant may be driven-in independently of the P-well dopant.

Another object is to provide such a process which enables independent control of both the well and field-dopant profiles.

In summary, the invention achieves the above objects by the use of a single lithographic masking step to form a well mask and define an oxidation barrier which, then, acts as: an implant mask (absorber) during the ion-implantation of a field dopant of one type; an oxidation barrier over one well during the oxidation of the opposite-type well to form over the one well a sacrificial oxide layer which forms the alignment marks for subsequent formation of the field-doping regions; and a dopant-transmitter during the ion-implantation of an opposite-type field dopant which is simultaneously absorbed by the sacrificial oxide.

More specifically, in a preferred embodiment the invention involves depositing a silicon nitride layer over a silicon dioxide layer which is disposed over an epitaxial silicon layer. A photoresist mask defines on the silicon nitride layer the positions of the N-wells and the P-wells, leaving the N-well areas exposed, and the silicon nitride layer is removed from those areas. An N-type conductivity-determining impurity is implanted through the exposed silicon dioxide layer and into the epi-layer, using the photoresist as a mask for the P-wells. A lift-off material, which may be chosen to withstand high temperatures, is deposited over the structure through lift-off techniques, and the photoresist with its lift-off material is lifted or removed from the P-wells. The N-well dopants may then be independently driven into the epi-layer to form the N-wells. A P-type dopant is then implanted into the structure for the formation of the P-well regions, using the lift-off material as a mask to keep the P-dopants out of the N-well regions. The lift-off material is then removed from the N-well regions, and an annealing step is used further to drive in the dopants to complete the formation of the profiles of both well regions. During the same step, a relatively thin sacrificial silicon dioxide layer is grown over the N-well region not covered by the silicon nitride layer. This grown oxide layer provides an alignment mark for subsequent processing steps. P-type field dopants are then implanted into the thin original silicon dioxide layer, which is over the P-well regions and underneath the nitride layer, and into the thicker grown silicon dioxide layer over the N-well regions. The silicon dioxide layer over the N-wells is removed, using the nitride layer as a mask to protect the silicon dioxide layer over the P-wells, and a new silicon dioxide layer is grown in its place. An N-type dopant is implanted into the new silicon dioxide layer over the N-well region, with the nitride layer now absorbing and preventing any N-type ions from reaching the silicon dioxide layer over the P-wells.

Then, the already established alignment mark can be used in subsequent lithographic masking steps to form a complete device. For example, a thick oxide layer is deposited and defined by a lithographic masking step to provide field isolation regions around the well regions. During the definition of the field isolation oxide regions, the previously doped oxide layers in the active device regions of both type wells are removed, thereby leaving the remaining doped layers over only the defined isolation regions; a subsequent heat cycle drives the N and P type dopants out of their respective remaining oxide layers and into the selected epi-regions to form the field-dopings beneath the oxide field isolations.

BRIEF DESCRIPTION OF THE DRAWING

FIGS. 1–11 diagrammatically illustrate the essential process steps of the preferred embodiment of the invention.

DETAILED DESCRIPTION OF THE PREFERRED EMBODIMENT

Figure 11:
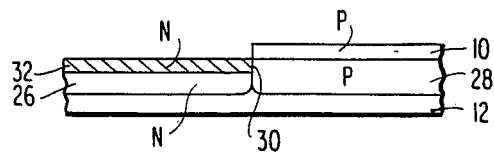

In the preferred embodiment of the process for forming, with a single lithographic masking step, a CMOS semiconductor structure having twin wells, which are self-aligned to each other, and an alignment feature self-aligned to the wells for use in subsequent lithographic masking steps for forming, for example, field isolation regions, the following sequential steps are employed.

(1) As shown in FIG. 1, in the initial step, a relatively thin (approximately 25 nm) silicon dioxide layer 10 is grown on an appropriate substrate 12, such as lightly doped epitaxial silicon on a heavily doped substrate. A relatively thin (10–20 nm) layer 14 of silicon nitride ($Si_3N_4$) is deposited over the oxide layer 10.

(2) As shown in FIG. 2, a relatively thick photoresist layer 16 (FIG. 2) a deposited over layer 14, and, then a lithographic masking step is employed to define in the photoresist layer 16 twin-well regions. The areas over regions which are to become N-type wells are removed, together with the underlying silicon nitride layer 14, to form areas 18 which are exposed to the oxide layer 10 (see FIG. 3). The photoresist layer 16 should be thick enough to stop the implantation of N-type impurities in a subsequent step, and should be of a material which is compatible with the lift-off material used in a subsequent step, as disclosed in U.S. Pat. No. 4,244,752.

(3) N-type impurities (donor species), such as phosphorus or arsenic, are ion-implanted through the oxide layer 10 in the area 18 and into the substrate 12 to form N-type well regions 20. The implantation energy and the thickness of the photoresist layer 16 are chosen such that the desired implantations of the N-type well regions are achieved while the implant is prevented from reaching the P-type well regions by the thick photoresist layer 16 in combination with the layers 14 and 10. (See FIG. 4).

(4) Deposit a layer 22 of lift-off material, such as Al, Mo, W, etc., which is compatible with the photoresist material in layer 16. (See FIG. 5). The layer 22 should be of sufficient thickness to stop the boron implanted in a subsequent step for forming the P-well regions.

(5) Lift-off the photoresist 16 and the overlying layer 22 from the layer 14 over the regions that are to become P-wells. These P regions are now exposed (beneath the nitride film 14 and the oxide film 10). (See FIG. 6).

(6) This is an optional step in which, if desired, the N-well regions can now be driven or diffused into the substrate 12 by heating if the material of the lift-off layer 22 has been chosen to be capable of withstanding elevated temperature exposure. Such materials are metal (molybdenum, tungsten, etc.) or oxides. Such an optional step permits the N-well regions to be driven or diffused independently of the P-well regions.

(7) Implant P-type impurities (boron) to form the P-well regions 24, using the lift-off layer 22 as a mask to prevent implantation of the N-well regions 20. (See FIG. 7).

(8) Remove the lift-off layer 22 from the N-well regions 20, and anneal both wells 26 and 28 until their diffusion profiles are near the final desired conditions. At the same time, grow a layer 29 of moderate thickness (approximately 50 nm) of silicon dioxide over the N-wells 26 in order to provide in the substrate 12 an alignment step 30 for use in subsequent masking operations. (See FIG. 8).

(9) Implant P-type field-dopant impurities into the relatively thin oxide layer 10 over the P-type well 28. The thicker oxide 29 over the N-well region 26 will also be doped with P-type impurities, but the thickness of the oxide layer 29 will prevent these impurities from reaching the N-wells 26. (See FIG. 8).

(10) Etch away the doped oxide sacrificial layer 29 from the N-wells 26. The doped oxide layer 10 over the P-wells 28 will be protected by the existing silicon nitride layer 14 over these wells. (See. FIG. 9).

(11) Regrow a relatively thin (approximately 2540 nm) silicon dioxide layer 32 over the N-wells 26; the existing silicon nitride layer 14 will prevent oxidation over the P-wells 28. Implant N-type impurities, such as arsenic, into the relatively thin oxide layer 32 over the N-well regions 26. The implant voltage is chosen such that the silicon nitride layer 14 over the P-well regions 26 absorbs substantially all of this implant. (See FIG. 10).

(12) Strip from the P-well regions 28 the nitride layer 14 which has been doped with the N-type impurities in the preceeding step. (See FIG. 11).

At this point, the process has produced, with only a single lithographic masking step, twin-well structure in which the P-and N-wells 26 and 28 are aligned to each other and in which there has been formed an alignment step 30 at the boundaries of the P- and N-wells, together with the oxide layers 32 and 10 over the respective wells and already doped with an impurity of the conductivity type necessary to produce the field doping for each of the wells. These oxide layers are self-aligned to the step 30 which is self-aligned to the wells.

To complete the formation of the field isolations, the following additional steps are carried out in sequence.

Figure 12:
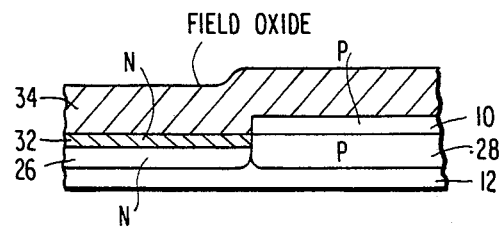
FIGS. 12–14 diagrammatically illustrate additional process steps for completing the field isolation regions using the alignment mark established in the steps of FIGS. 1–9.
Figure 13:
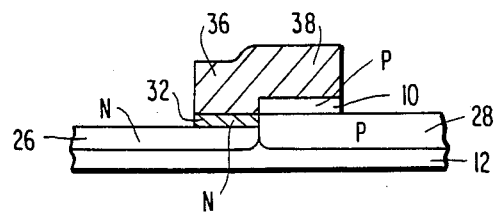

(13) Deposit a relatively thick oxide layer 34 (FIG. 12) to be used as field isolation and, using a lithographic masking step, define the field isolations by etching away the thick field oxide layer 34 except in those areas 36 and 38 which define the field isolation regions (FIG. 13). That is, during this etching process, the previously doped oxide layers 32 and 10 are removed from the active device regions of the respective wells 26 and 38.

Figure 14:
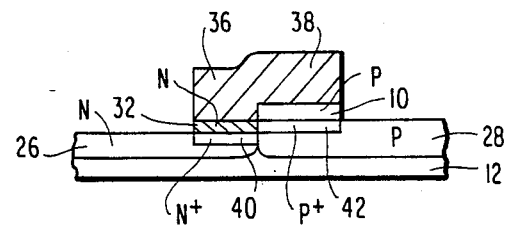

(14) Using an appropriate heat cycle, drive (diffuse) the N-type and P-type dopants from their respective doped oxide layers 32 and 10 and into the substrate to form the field dopings 40 and 42 under the field isolations 36 and 38, respectively. (See FIG. 14).

(15) Regrow dielectrics, deposit conductors, etc. to fabricate a device, such as an FET.

If desired, the lift-off steps may be eliminated so that only N-wells are formed in a P-type substrate. Otherwise the same steps are employed, but the photoresist masking layer 16 is removed in a separated step between the implant step (7) and the anneal step in step (8).

We claim:

1. A process of fabricating an integrated circuit having both P-well and N-well regions in a single semiconductor body, which process uses only a single lithographic masking step to define the positions of both of said well regions and also the position of doped field regions for controlling the parasitic threshold voltages of portions of said body, comprising:
   (a) forming a first electrically insulating layer on surface of said semiconductor body;
   (b) forming on said first layer a second electrically insulating layer from a material preselected to be impervious to oxygen diffusion therethrough;
   (c) lithographically forming a mask over said second electrically insulating layer to define the position of said N-well regions by exposed areas in the mask, and removing said second electrically insulating layer from said exposed areas;
   (d) implanting N-type conductivity-determining impurities in said semiconductor body, using said mask as an implantation mask to prevent implantation of said P-well regions;
   (e) forming on said first insulating layer over said N-well regions and on the mask over said P-well regions a layer of lift-off material, and then removing said mask over the P-well regions together with the lift-off material thereon;
   (f) implanting into said body P-type conductivity determining impurities using said lift-off material as an implantation mask to prevent P-type impurities from reaching into said N-well regions;
   (g) removing the removing lift-off material from said N-well regions, and annealing said semiconductor body to form the desired doping profiles in said P and N-well regions, and oxidizing said body to convert only the body portion in said N-well regions into an electrically insulating grown oxide layer, thus forming a step in said body for use as an alignment mark;
   (h) implanting said first insulating layer with P-type conductivity determining impurities, using the grown oxide layer over the N-well regions as a mask; and using said second electrically insulating layer over said P-well regions as an etching mask for removing the insulating and oxide layers from over said N-well regions; and (i) forming a new electrically insulating layer over said N-well regions, and implanting N-type conductivity determining impurities in said new electrically insulating layer over said N-well regions using said second electrically insulating layer over said P-wells as a masking layer to prevent said N-type conductivity determining impurities from reaching said first insulating layer portion positioned over said P-well regions;

thereby producing N- and P-well regions in said body with alignment marks on the surface of said body indicating the separation of said regions and with corresponding field-doped insulating layers over said regions, wherein the doped insulating layer over said N-well regions is doped with predominantly N-type impurities, and the doped insulation layer over said P-well regions is doped with predominantly P-type impurities.

2. The process claimed in claim 1 wherein said body is silicon, said first insulating layer is silicon dioxide, and said second insulating layer is silicon nitride.

3. The process claimed in claim 1 further comprising:
 (a) depositing a field isolation oxide layer over said body;
 (b) using said step as an alignment mark, defining field isolations in the isolation oxide layer over said well regions and removing the field-doped insulation layers from the active device regions of said well regions; and
 (c) driving the dopants from the remaining doped insulating layers into said body to form corresponding field dopings under the field isolations of said well regions.

4. The process claimed in claim 1 further comprising, between steps (e) and (f), annealing said semiconductor body to drive the N-type impurities into the N-well regions.

5. A process of fabricating an integrated circuit having both P-regions and N-well regions in a single P-type semiconductor body, which process uses only a single lithographic masking step to define the positions of both of said P-regions and N-well regions and also the position of doped field regions for controlling the parasitic threshold voltages of portions of said body, comprising:
 (a) forming a first electrically insulating layer on a surface of said semiconductor body;
 (b) forming on said first layer a second electrically insulating layer from a material preselected to be impervious to oxygen diffusion therethrough;
 (c) lithographically forming a mask over said second electrically insulating layer to define the position of said N-well regions by exposed areas in the mask, and removing said second electrically insulating layer from said exposed areas;
 (d) implanting N-type conductivity determining impurities impurities in said semiconductor body, using said mask as an implantation mask to prevent implantation of said P-regions;
 (e) removing the masking;
 (f) annealing said semiconductor body to form the desired doping profiles in said N-well regions, and oxidizing said body to convert only the body portion in said N-well regions into an electrically insulating grown oxide layer, thus forming a step in said body for use as an alignment mark;
 (g) implanting said first insulating layer with P-type conductivity determining impurities, using the grown oxide layer over the N-well regions as a mask; and using said second electrically insulating layer over said P-regions as an etching mask for removing the insulating and oxide layers from over said N-well regions; and
 (h) forming a new electrically insulating layer over said N-well regions, and implanting N-type conductivity determining impurities in said new electrically insulating layer over said N-well regions using said second electrically insulating layer over said P-regions as a masking layer to prevent said N-type conductivity determining impurities from reaching said first insulating layer portion positioned over said P-regions;

thereby producing N-well regions and P-regions in said body with alignment marks on the surface of said body indicating the separation of said regions and with corresponding field-doped insulating layers over said regions, wherein the doped insulating layer over said N-well regions is doped with predominantly N-type impurities, and the doped insulation layer over said P-regions is doped with predominantly P-type impurities.

6. The process claimed in claim 5 wherein said body is silicon, said first insulating layer is silicon dioxide, and said second insulating layer is silicon nitride.

7. The process claimed in claim 5 further comprising:
 (a) depositing a field isolation oxide layer over said body;
 (b) using said step as an alignment mark, defining field isolations in the isolation oxide layer over said P-regions and N-well regions and removing the field-doped insulation layers from the active device regions of said P-regions and N-well regions; and
 (c) driving the dopants from the remaining doped insulating layers into said body to form corresponding field dopings under the field isolations of said P-regions and N-well regions.

* * * * *